United States Patent
Schimper

(10) Patent No.: US 8,797,079 B2
(45) Date of Patent: Aug. 5, 2014

(54) DIFFERENTIAL DELAY LINE, RING OSCILLATOR AND MOBILE COMMUNICATION DEVICE

(71) Applicant: Intel Mobile Communications GmbH, Neubiberg (DE)

(72) Inventor: Markus Schimper, Moosinning (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/631,176

(22) Filed: Sep. 28, 2012

(65) Prior Publication Data

US 2014/0091847 A1  Apr. 3, 2014

(51) Int. Cl.
*H03H 11/26* (2006.01)
(52) U.S. Cl.
USPC .............................. 327/261; 327/266; 327/274
(58) Field of Classification Search
USPC .......................................... 327/261, 266, 274
See application file for complete search history.

(56) References Cited

U.S. PATENT DOCUMENTS

| | | | |
|---|---|---|---|
| 7,564,284 B2 * | 7/2009 | Henzler et al. | 327/261 |
| 2001/0015666 A1 * | 8/2001 | Noda et al. | 327/269 |
| 2009/0219073 A1 * | 9/2009 | Sun et al. | 327/285 |

OTHER PUBLICATIONS

Matthew Z. Straayer, et al. "A Multi-Path Gated Ring Oscillator TDC With First-Order Noise Shaping" IEEE Journal of Solid-State Circuits, vol. 44, No. 4, Apr. 2009. 10 Pages.
Stephan Henzler, et al. "90nm 4.7ps-Resolution 0.7-LSB Single-Shot Precision and 19pJ-per-Shot Local Passive Interpolation Time-to-Digital Converter with On-Chip Characterization" 2008 IEEE International Solid-State Circuits Conference. Feb. 3-7, 2008. 3 Pages.

\* cited by examiner

*Primary Examiner* — John Poos
(74) *Attorney, Agent, or Firm* — Eschweiler & Associates, LLC

(57) ABSTRACT

A differential delay line includes a series connection of a plurality of differential delay stages. Each differential delay stage includes a first delay element and a second delay element. The first delay element has a first input, a second input and an output. The second delay element has a first input, a second input and an output. The output of the first delay element of an n-th differential delay stage of the plurality of differential delay stages is coupled to an input of the second delay element of an (n+m)-th differential delay stage of the plurality of differential delay stages, wherein m is an even natural number larger than or equal to two.

32 Claims, 9 Drawing Sheets

DIFFERENTIAL DELAY LINE, RING OSCILLATOR AND MOBILE COMMUNICATION DEVICE

BACKGROUND

Many time to digital converters (TDCs) nowadays use single-ended ring oscillators or differential topologies with small latches for synchronization of the two independent running single-ended ring oscillators or delay lines. The advantage of differential ring oscillators or delay lines over single-ended topologies is 20 dB more power supply rejection ratio (PSRR). In addition, differential ring oscillators and delay lines do not suffer from even and odd delay dependency due to process induced mismatch between rising and falling edge.

Today's single-ended ring oscillators and delay line topologies are used with tolerating the disadvantages of reduced power supply rejection ratio performance, which lead to increased supply ripple and noise requirement. The single-ended topology has even/odd delay variations as explained above, therefore the time to digital converter quantization noise floor increases. The increased quantization noise floor leads to, for example in wireless transmitters, EVM degradation (EVM error vector magnitude). In the currently used modulation schemes the EVM performance is sufficient but future modulation schemes and ADPLL topologies (ADPLL—all digital phase locked loop) will ask for a better TDC noise performance. Conventional differential ring oscillators or delay lines use small latches as a synchronization technique. These additional latches increase the intrinsic delay and therefore the quantization noise floor of the TDC even when resolution enhancement techniques as multipath or resistive interpolation are used.

SUMMARY

A differential delay line comprises a series connection of a plurality of differential delay stages, each differential delay stage comprising a first delay element including a first input, a second input and an output and a second delay element including a first input, a second input and an output. The output of the first delay element of an n-th differential delay stage of the plurality of differential delay stages is coupled to an input of the second delay element of an (n+m)-th differential delay stage of the plurality of differential delay stages, wherein m is an even natural number larger than or equal to two.

A ring oscillator comprises a differential delay line as described above.

A mobile communication device comprises an antenna port, an RF frontend, a digital baseband processor, and a differential delay line as described above. The differential delay line is comprised in the RF frontend or in the digital baseband processor. The RF frontend of the mobile communication device is coupled to the antenna port and the digital baseband processor of the mobile communication device.

DETAILED DESCRIPTION

In the following description a coupling between two terminals should be understood as a direct low ohmic coupling or an indirect coupling with one or more elements between, such that a signal at a second node is dependent on a signal at a first node, which is coupled to the second node. Between two coupled terminals a further element may be coupled, but not necessarily need to be, such that two terminals which are coupled to each other may be also directly connected to each other (e.g. by means of a low impedance connection, such as a wire or a wire trace).

Furthermore, a first terminal is directly connected to a second terminal, if a signal at the second terminal is equal to a signal at the first terminal, wherein parasitic effects or minor losses due to conductor resistances shall not be regarded. In other words, two terminals which are directly connected to each other are typically connected by means of wire traces or wires without additional elements in between.

Furthermore, a first terminal of a transistor may be a source terminal or an emitter terminal of the transistor or may be a drain terminal or a collector terminal of the transistor. A second terminal of the transistor may be a drain terminal or a collector terminal of the transistor or may be a source terminal or an emitter terminal of the transistor. A control terminal of the transistor may be a gate terminal or a base terminal of the transistor. Therefore, a switchable path of a transistor may be a drain source path or an emitter collector path of the transistor. A main transistor current is typically routed from the first terminal to the second terminal of the transistor or vice versa.

Furthermore two nodes or terminals are electrically coupled if a coupling path (e.g. a switchable path of a transistor) between the two coupled nodes or terminals is in a low impedance state and are electrically decoupled if the coupling path is in a high impedance state.

Figure 1:
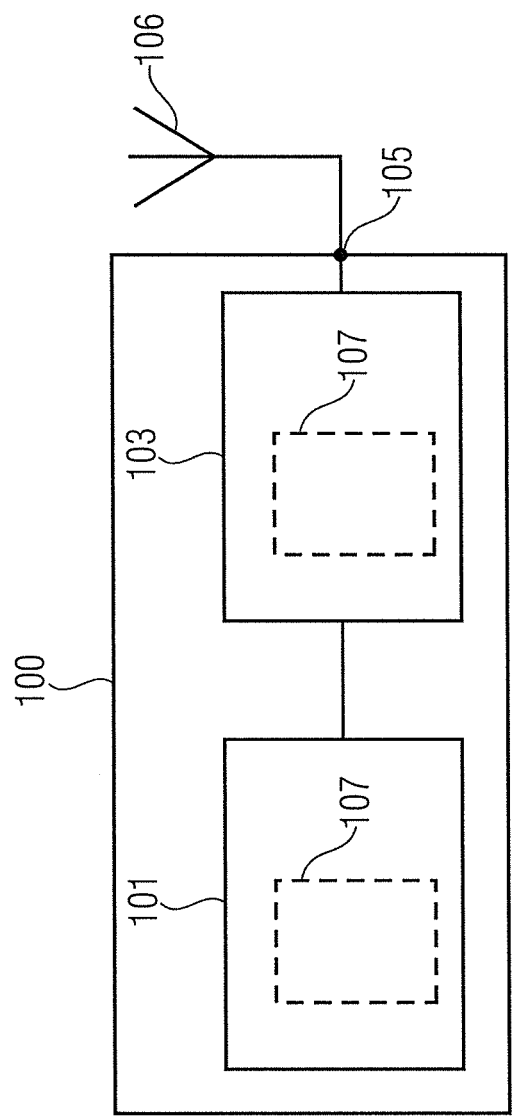
FIG. 1 shows an exemplary mobile communication device comprising at least an exemplary differential delay line.

FIG. 1 shows an exemplary mobile communication device 100. The mobile communication device 100 comprises a digital baseband processor 101, an RF frontend 103 and an antenna port 105, for example, for connecting to an antenna 106. Furthermore, the mobile communication device 100 comprises an exemplary differential delay line 107. The differential delay line 107 is comprised in the digital baseband processor 101 or in the RF frontend 103. Nevertheless, it is also possible that each of the digital baseband processor 101 and the RF frontend 103 comprises such a differential delay line 107 or even comprises more than one of such differential delay line 107. The RF frontend 103 is coupled to the digital baseband processor 101 and the antenna port 105.

The differential delay line 107 may be one of the differential delay lines described in the following in conjunction with the FIGS. 2 to 4.

As will be described in the following, the differential delay line 107 provides a delay mismatch between the two single ended chains (formed by the first delay elements and the second delay elements) of the differential delay line. The delay mismatch may be counteracted in few delays which leads to a symmetrical clock generation and, therefore reduces a quantization noise. For example, the quantization noise is reduced if the differential delay line 107 is used in a time to digital converter of the mobile communication device 100. Furthermore, the differential delay line 107 achieves a resolution enhancement, for example, when the differential delay line 107 is used for measuring time between certain events. Hence, the differential delay line 107 enables or facilitates a more precise generation of clock signals in the mobile communication device 100 and a more precise measuring of time differences (such as it may be needed in a DPLL). The improved generation of clock signals and improved measuring of time differences enables a reduction of a noise floor in the mobile communication device 100 and therefore improves or facilitates the overall performance of the mobile communication device 100.

As shown above, the differential delay line 107 can be part of a time to digital converter of the mobile communication device 100. Such a time to digital converter could be used, for example, in a DPLL of the mobile communication device 100 or at every other place in which time difference have to be measured in the mobile communication device 100.

The mobile communication device 100 may be a portable mobile communication device.

As an example, the mobile communication device 100 may be configured to perform a voice and/or data communication (according to a mobile communication standard) with another (portable) mobile communication device and/or a mobile communication base station. Such a mobile communication device may be, for example, a mobile handset, such as a mobile phone (cell phone), a so called smart phone, a tablet PC, a broadband modem, a notebook or a laptop as well as a router, switch, repeater or a PC. Furthermore, such a mobile communication device may be a mobile communication base station.

Although in FIG. 1, the differential line 107 is presented as part of the mobile communication device 100, this differential delay line 107 may also be used in other circuits or devices. In the following different exemplary implementations of such differential delay line 107 will be described in more detail.

Figure 2:
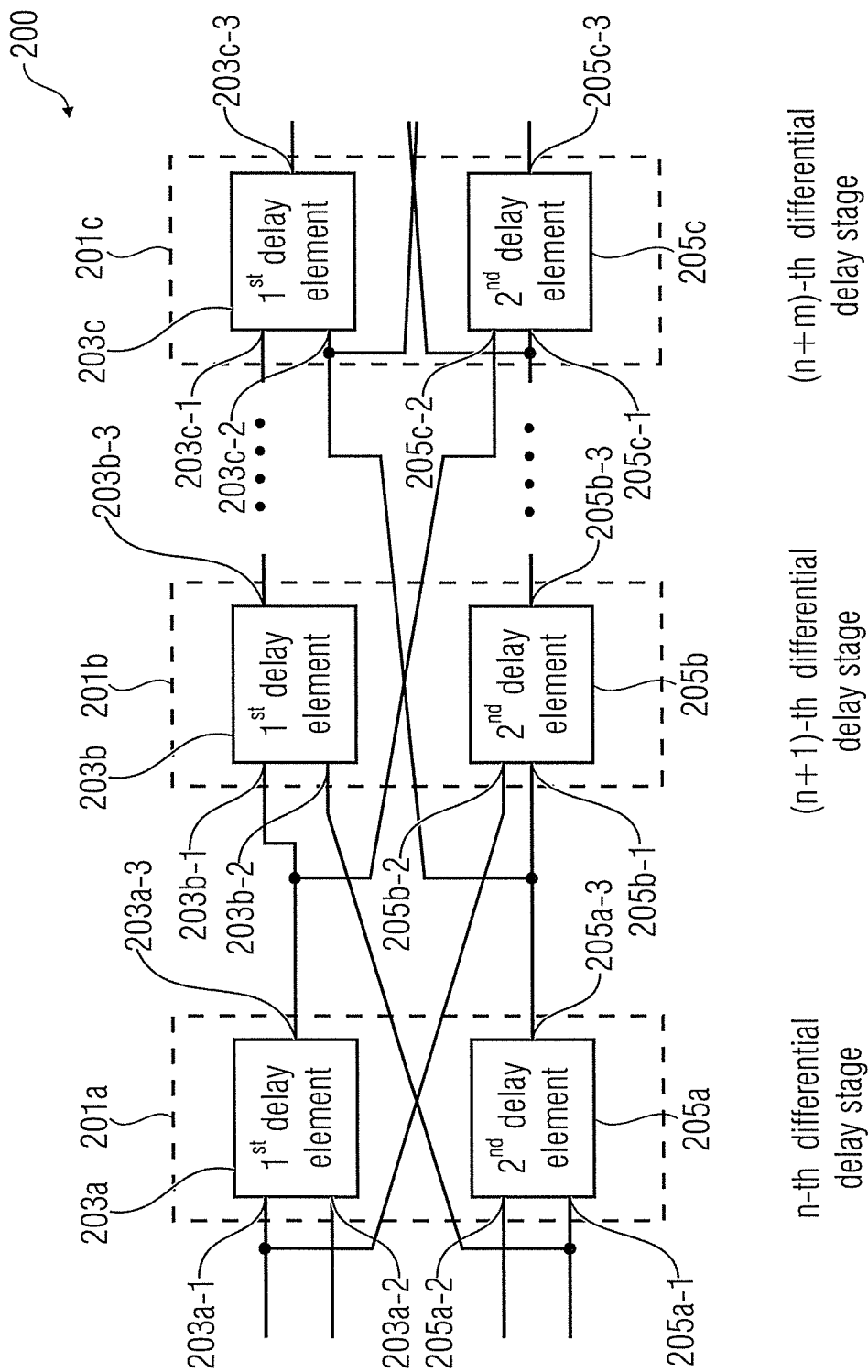
FIG. 2 shows an exemplary delay line in which an output of a first delay element of an n-th differential delay stage is coupled to an input of a second delay element of an (n+m)-th differential delay stage.

FIG. 2 shows an exemplary differential delay line 200. The differential delay line 200 includes a series connection of a plurality of differential delay stages 201a, 201b, 201c. Each differential delay stage 201a to 201c includes a first delay element 203a to 203c and a second delay element 205a to 205c. Each of the first delay elements 203a to 203c has a first input 203a-1 to 203c-1, a second input 203a-2 to 203c-2 and an output 203a-3 to 203c-3. Furthermore, each of the second delay elements 205a to 205c has a first input 205a-1 to 205c-c, a second input 205a-2 to 205c-2 and an output 205a-3 to 205c-3. The first delay elements 203a to 203c are connected in series to form a first single ended delay chain. The second delay elements 205a to 205c are connected in series to form a second single ended delay chain.

The output 203a-3 of the first delay element 203a of an n-th differential delay stage 201a is coupled to an input (in the example shown in FIG. 2 to the second input 205c-2) of the second delay element 205c of an (n+m)-th differential delay stage 201c of the plurality of differential delay stages 201a to 201c, wherein m is an even natural number larger than or equal to 2.

With the architecture of the differential delay line 200 shown in FIG. 2 having the crossing of the two single delay lines or delay chains of the differential delay line 200 (from the first delay element 203a of the n-th differential delay stage 201a to the second delay element 205c of the (n+m)-th differential delay stage 201c) it may be achieved that an output signal provided at the output 205c-3 of the second delay element 205c is derived by performing an interpolation based on signals received at its inputs 205c-1 to 205c-2. By interpolating between these two signals, run time differences between the first delay elements 203a to 203c and the second delay elements 205a to 205c can be obtained and compensated for. As the differences are obtained, the output signal provided at the output 205c-3 of the second delay element 205c is based on both, an output signal of the first delay element 203a of the n-th differential delay stage 201a and an output signal of a second delay element of a differential delay stage preceding the (n+m)-th differential delay stage 201c. In other words, the differential delay line 200 uses a multipath interpolation in a differential manner to synchronize the independent running single ended ring oscillator delay lines or delay chains and for resolution enhancement. A first one of these single ended delay chains is formed by the first delay elements 203a to 203c and a second one of these single ended delay chains is formed by the second delay elements 205a to 205c.

Thus, the differential multipath chain 200 as shown in FIG. 2 counteracts the delay mismatch between the first delay chain of the first delay elements 203a to 203c and the second delay chain of the second delay elements 205a to 205c by the topology in few delays.

As described, the synchronization of the two delay chains of the differential delay line 200 enables a better noise performance as it reduces the quantization noise floor of a time to digital converter in which the differential delay line 200 is used.

The differential delay line 200 could also be described from the perspective of the input signals provided to the delay elements. Hence, a signal at the first input 203a-1 of the first delay element 203a of the n-th differential delay stage 201a is also applied to an input (in the example shown in FIG. 2 the second input 205b-2) of the second delay element 205b of the (n+1)-th differential delay stage 201b. In general, the signal at the first input 203a-1 of the first delay element 203a of the n-th differential delay stage 201a may be provided to the input of a second delay element of a differential delay stage following the n-th differential delay stage 201a.

In one example in implementation, the signal at the first input 203a-1 of the first delay element 203a is provided to an input of the second delay element of an (n+i)-th differential delay stage, wherein i is an odd number larger than or equal to one. By having this implementation, it is not necessary to perform an inversion of the signal at the first input 203a-1 before it is provided to an input of the second delay element of the (n+i)-th differential delay stage.

Furthermore, the differential delay line 200 includes the following additional features.

The output 203a-3 to 203c-3 of the first delay element 203a to 203c of each differential delay stage 201a to 201c is coupled to the first input 203b-1 to 203c-1 of the first delay element 203b to 203c of a directly succeeding differential delay stage 201b to 201c. Furthermore, the output 205a-3 to 205b-3 of the second delay element 205a to 205b of each differential delay stage 201a to 201b is coupled to the first input 205b-1 to 205c-1 of the second delay element 205b to 205c of the directly succeeding differential delay stage 201b to 201c. Hence, each of the second delay elements 205b to 205c receives a signal provided by a second delay element 205a to 205b of a preceding differential delay stage 201a to 201b and also, a signal provided by a first delay element 203a of the preceding differential delay stage.

These two signals may be interpolated by the second delay elements to derive their output signal provided at their corresponding outputs 205a-3 to 205c-3. Furthermore, the output 205a-3 of a second delay element 205a of the n-th differential delay stage 201a is coupled to the second input 203c-2 of the first delay element 203c of the (n+m)-th differential delay stage 201c. Hence, the described interpolation between a signal from the first chain of the differential delay 200 and the second chain of the differential delay line 200 is not only performed in the second delay elements 205a to 205c but may also be performed in the first delay elements 203a to 203c. This cross coupling of the output signals of the two different (single ended) delay chains of the differential delay line 200 provides a synchronization of both delay chains of the differential delay line 200.

Thus, each of the first delay elements 203a to 203c may be configured to generate its output signal at its output 203a-3 to 203c-3 by performing an interpolation of the signals received at its inputs 203a-1 to 203c-1, 203a-2 to 203c-2.

Furthermore, a signal at the first input 205a-1 of the second delay element 205a of the n-th differential delay stage 201a is also supplied to the second input 203b-2 of the first delay element 203b of the (n+1)-th differential delay stage 201b (or in general to a second input of a first delay element of an (n+i)-th differential delay stage wherein i is an odd number larger than or equal to one).

Further, the described connections between the outputs of the delay elements of the differential delay stages 201a to 201c and the inputs of the delay elements of the differential delay stages 201a to 201c may be direct connections (e.g., such that between an output of a delay element and an input of a further delay element which is coupled to the output no further (delay) element is provided).

As an example, the signal at the first input 203a-1 of the first delay element 203a of the n-th differential delay stage 201a is provided to the second input 205b-2 of the second delay element 205b of the (n+1)-th differential delay stage 201b without any further delay element in between. Or in other words, the output 203a-3 of the first delay element 203a of the n-th differential delay stage 201a is directly connected to the second input 205c-2 of the second delay element 205c of the (n+m)-th differential delay stage 201c (without any further delay element in between).

In the example of FIG. 2 the delay elements include two inputs (also referred to as interpolation inputs). However, other delay elements including additional inputs, i.e., more than two inputs, may be used.

Figure 3A:
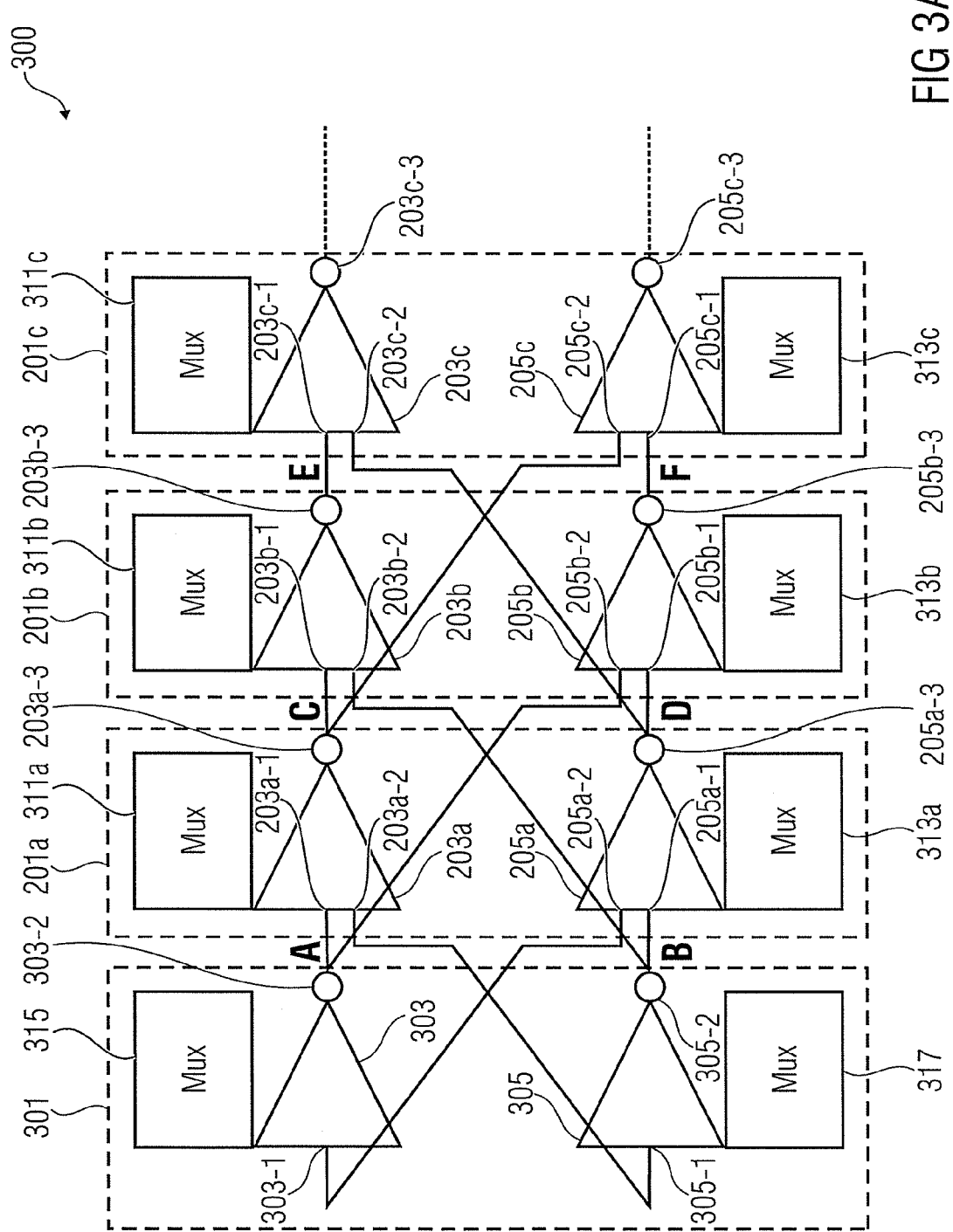
FIG. 3a shows another exemplary delay line in which m=2 and with additional start edge multiplexers.

FIG. 3a shows a differential delay line 300 which is an exemplary implementation of the differential delay line 200 in which m=two and i=one.

The differential delay line 300 includes a series connection of the differential delay stages 201a to 201c. Furthermore, the differential delay line 300 has a further differential delay stage 301, which precedes the series connection of the plurality of differential delay stages 201a to 201c.

From FIG. 3a it may be seen that the output of each first delay element of each differential delay stage is coupled to (e.g. directly connected to) the first input of the first delay element of the directly succeeding differential delay stage. Furthermore, the output of each second delay element of each differential delay stage is coupled to (e.g. directly connected to) the first input of the second delay element of the directly succeeding differential delay stage.

Furthermore, the output of the first delay element of each differential delay stage is coupled to (e.g. directly connected to) the second input of the second delay element of the next but one differential delay stage and the output of the second delay element of each differential delay stage is coupled to (e.g. directly connected to) the second input of the first delay element of the next but one differential delay stage.

The structure of the further delay stage 301, which precedes the series connection of the plurality of differential delay stages 201a to 201c may be equal to the structure of one of the differential delay stages 201a to 201c or (as shown in FIG. 3a) may slightly differ in that a first delay element 303 of the further differential delay stage 301 includes a single input 303-1 (and no further inputs) and a second delay element 305 of the further differential delay stage 301 includes a single input 305-1 (and no further inputs).

The single input 303-1 of the first delay element 303 of the further differential delay stage 301 is coupled to (e.g. directly connected to) the second input 205a-2 of the second delay element 205a of the n-th differential delay stage 201a (e.g. n=2). The single input 305-1 of the second delay element 305 of the further differential delay stage 301 is coupled to (e.g. directly connected to) the second input 203a-2 of the first delay element 203a of the n-th differential delay stage 201a.

An output 303-2 of the first delay element 303 of the further differential delay stage 301 is coupled to (e.g. directly connected to) the first input 203a-1 of the first delay element 203a of the n-th differential delay stage 201a and furthermore to the second input 205b-2 of the second delay stage 205b of the (n+1)-th differential delay stage 201b.

An output 305-2 of the second delay element 305 of the further differential delay stage 301 is coupled to (e.g. directly connected to) the second input 203b-2 of the first delay element 203b of the (n+1)-th differential delay stage 201b and the first input 205a-1 of the second delay element 205a of the n-th differential delay stage 201a.

In the example shown in FIG. 3a, the further differential delay stage 301 could be a first differential delay stage of the differential delay line 300. Nevertheless, in an application of the differential delay line 300 in a ring oscillator, typically each delay element of each differential delay stage of such a ring oscillator may comprise a plurality of inputs. Or in a further exemplary implementation, the delay elements 303, 305 could each comprise two inputs based on which the delay elements provide their output signals at their outputs 303-2, 305-2.

As shown in FIG. 3a, a delay element (such as the first delay element 203a) may be implemented as an inverter, for example, such that an output signal provided at the output 203a-3 of the first delay element 203a is the inverse of an input signal received at the first input 203a-1 of the first delay element 203a. Furthermore, as the delay elements may be configured to derive their output signals by performing an interpolation based on the signals received at their inputs, the output signal provided at the output 203a-3 may also be the inverse of the input signal received at the second input 203a-2 of the first delay element 203a.

Each of the delay elements may be configured to provide an output signal at its output based on an inverted version of an input signal received at its first input and an inverted version of an input signal received at its second input.

To summarize, from FIG. 3a it can be seen that the output of the first delay element of each differential delay stage of the differential delay line 300 is coupled to an input of the second delay element of the next but one differential delay stage. Furthermore, the output of the second delay element of each differential delay stage is coupled to an input of the first delay element of the next but one differential delay stage. The coupling with the next but one differential delay stage (and not the next differential delay stage) achieves that no further (inverting) delay element has to be spent or provided between the output of a first delay element and the second input of a second delay element coupled to this output. Furthermore, no further (inverting) delay element has to be spent or provided between the output of a second delay element and the second input of a first delay element coupled to the second delay element.

Figure 3B:
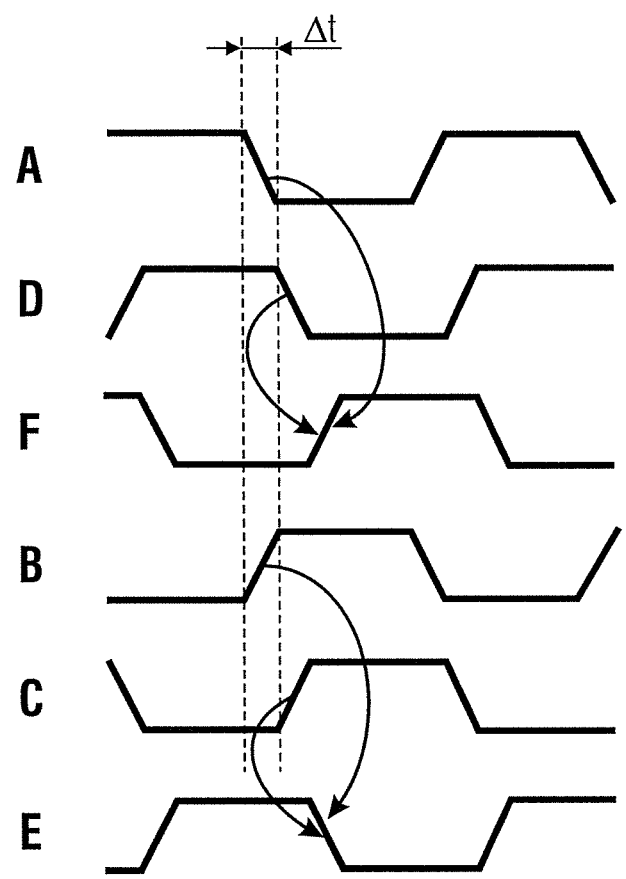
FIG. 3b shows a diagram illustrating how in an exemplary delay element an output signal is interpolated based on two input signals of the delay element.

In FIG. 3b an example for the input signals and output signals of the first delay element 203b and the second delay element 205b of the (n+1)-th differential delay stage 201b are shown. "A" designates the input signal at the second input 205b-2 of the second delay element 205b of the (n+1)-th differential delay stage 201b. "D" designates the input signal at the first input 205b-1 of the second delay element 205b of the (n+1)-th differential delay stage 201b and "F" designates the output signal at the output 205b-3 of the second delay element 205b of the (n+1)-th differential delay stage 201b.

Additionally, "B" designates the input signal at the second input 203b-2 of the first delay element 203b of the (n+1)-th differential delay stage 201b, "C" designates the input signal at the first input 203b-1 of the first delay element 203b of the (n+1)-th differential delay stage 201b and "E" designates the output signal at the output 203b-3 of the first delay element 203b of the (n+1)-th differential delay stage 201b.

From FIG. 3b it may be seen that the falling edges of the signals A and D (at the inputs 205b-1, 205b-2) are interpolated to the rising edge in the signal F (at the output 205b-3).

As the signal A is provided by the first delay element 303 of the further differential delay stage 301 and the signal B is provided by the second delay element 305 of the further differential delay stage 301, the signal B is the inverse of the signal A.

Furthermore, as the signal C is provided by the first delay element 203a of the n-th differential delay stage 201a and the signal D is provided by the second delay element 205a of the n-th differential delay stage 201a the signal D is the inverse of the signal C.

Thus, the signal F is the inverse of the signal E. Hence, not only the falling edges of the signals A and D are interpolated to the rising edge of signal F, but also the rising edges of the signals B and C are interpolated to the falling edge of signal E.

This differential multipath delay chain 300 provides a delay mismatch in the positive chain (e.g. formed by the first delay elements 303, 203a to 203c) and in the negative chain (e.g. formed by the second delay elements 305, 205a to 205c), which is counteracted by the topology in few delays. The superior delay alignment forces the comparator common voltage of a comparator connected between the two outputs of one of the differential delay stages to VDD/2. Hence, the topology shown in FIG. 3a enables a fully symmetrical clock generation.

Furthermore, in FIG. 3b the delay Δt between the falling edges of the signals A and D and the rising edges of the signals B and C is shown. This difference Δt corresponds to the unit delay of the first delay element 203a (for the signal C) and the second delay element 205a (for the signal D) of the n-th differential delay stage 201a. Without the interpolation shown in FIG. 3b between the two chains of the differential delay line 300, differences in this unit delay between the first delay elements and the second delay elements would lead to the case that the two chains of the differential delay line 300 would not run synchronously anymore and the resulting differential output signal of the differential delay line 300 is not fully symmetrical anymore. As a result, the interpolation as shown in FIG. 3b compensates for the delay mismatches due to different unit delays of the first delay elements and the second delay elements by cross-coupling outputs of the first delay elements with inputs of the second delay elements and outputs of the second delay elements with inputs of the first delay elements.

Figure 3C:
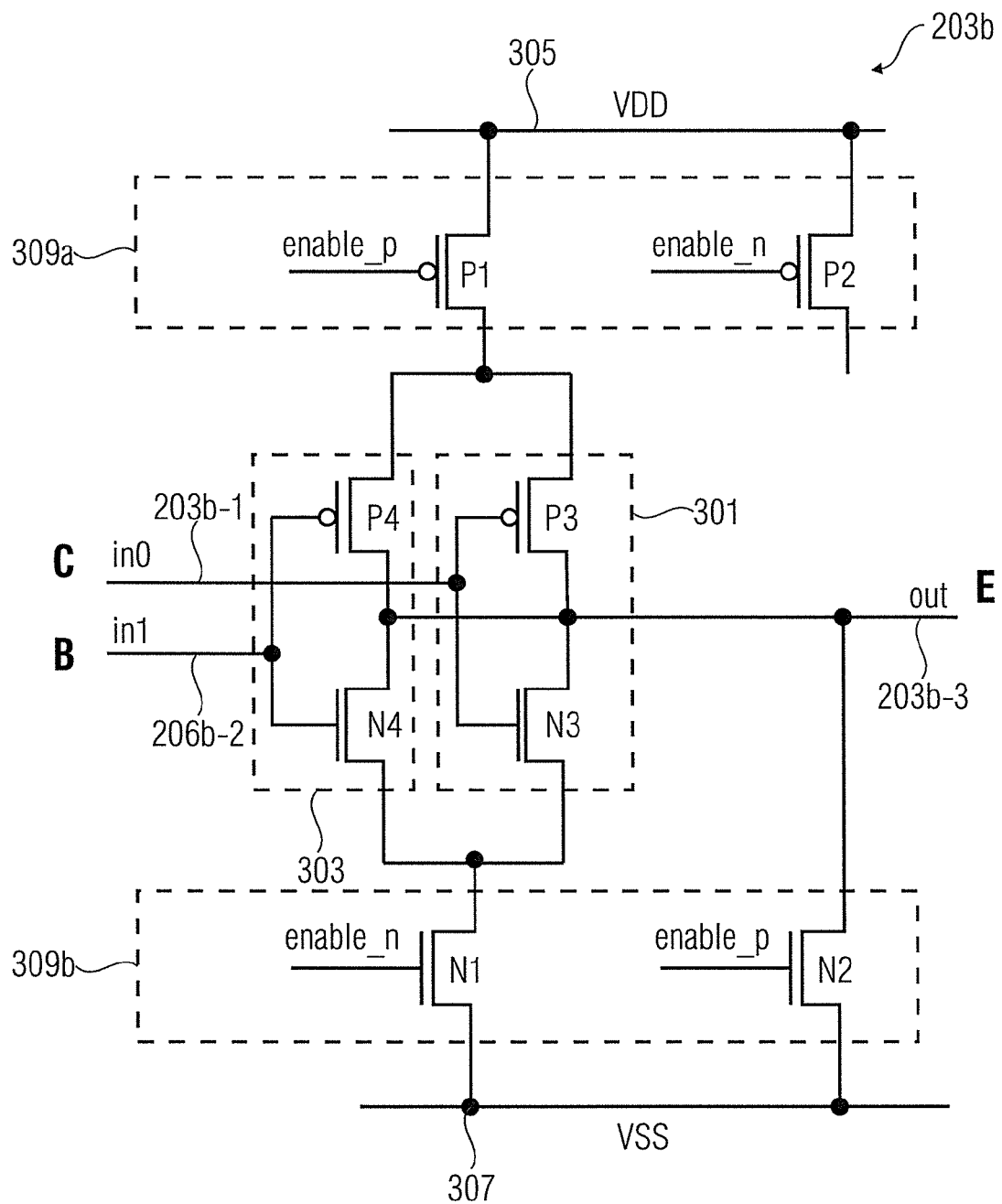
FIG. 3c shows a circuit diagram of an exemplary delay element.

FIG. 3c shows an exemplary implementation of the first delay element 203b of the (n+1)-th differential delay stage 201b. Nevertheless, the other delay elements of the plurality of differential delay stages 201a to 201c may have the same schematic as shown in FIG. 3c.

The delay element 203b or the delay element circuitry 203b includes a first inverter 301 and a second inverter 303. The first inverter 301 is coupled between the first input 203b-1 and the output 203b-3. The second inverter 303 is coupled between the second input 203b-2 and the output 203b-3. In other words, the two inverters 301, 303 are coupled to (e.g. directly connected to) the same output 203b-3 of the delay element 203b.

The first inverter 301 includes a first transistor P3 of a first transistor type (e.g. PMOS) and a second transistor N3 of a second transistor type (e.g. NMOS). Furthermore, the second inverter 303 includes a first transistor P4 of the first transistor type and a second transistor N4 of the second transistor type.

Control terminals of the first transistor P3 and the second transistor N3 of the first inverter 301 are coupled to or form the first input 203b-1 of the delay element 203b. A common terminal of the two transistors P3, N3 of the first inverter 301 forms the output of the first inverter 301 and is coupled to the output 203b-3 of the delay element 203b.

Furthermore, control terminals of the first transistor P4 and the second transistor N4 of the second inverter 303 are coupled to or form the second input 203b-2 of the delay element 203b. A common terminal of the first transistor P4 and the second transistor N4 of the second inverter 303 forms the output of the second inverter 303 and is coupled to the output of the first inverter 301 and therefore also to the output 203b-3 of the delay element 203b. In other words, the inverters 301, 303 have the common output 203b-3.

The input In0 of the first inverter 301 (the first input 203b-1 of the delay element 203b) is connected to the output of the previous delay element of the same delay element chain (e.g. to the output 203a-3 of the first delay element 203a of the n-th differential delay stage 101a).

The input In1 of the second inverter 303 (the second input 203b-2 of the delay element 203b) is connected to the output of the delay element before the previous delay element of the opposite delay element chain (e.g. to the output 305-2 of the second delay element 305 of the further differential delay stage 301).

In the example shown in FIG. 3c, the second delay element 203b receives the signal C at the input In0, and the signal B at the input In1 and the output signal generated at the output 203b-3 of the delay element 203b is the signal E. In the case of the second delay element 205b, the input In0 would receive the signal D and the input In1 would receive the signal A and at the output of the second delay element 205b the signal F would be provided.

Furthermore, the inverters 301, 303 may be directly connected to a first supply terminal 305 and a second supply terminal 307. At the first supply terminal 305 a supply potential VDD is provided and at a second supply terminal 307 a ground potential VSS is provided. Nevertheless, as shown in FIG. 3c, the inverters 301, 303 may also be coupled by means of function selection circuits 309a, 309b to the first supply terminal 305 and the second supply terminal 307. Such a function selection circuit 309a, 309b is configured to selectively provide a supply potential to the inverters 301, 303 or to force the output 203b-3 of the delay element 203b to a predetermined potential.

A first function selection circuit 309a includes a first transistor P1 of the first transistor type and a second transistor P2 of the first transistor type. A switchable path of the first transistor P1 of the first function selection circuit 309a is coupled between the first supply voltage terminal 305 and first supply inputs of the inverters 301, 303 (e.g. two first terminals of the transistors P3, P4). A switchable path of the second transistor P2 of the first function selection circuit 309a is coupled between the first supply terminal 305 and the output 203b-3 of the first delay stage 203b.

Furthermore, the second function selection circuit 309b includes a first transistor N1 of the second transistor type and a second transistor N2 of the second transistor type. The first transistor N1 of the second function selection circuit 309b is coupled between second supply terminals of the inverters 301, 303 (e.g. two second terminals of the transistors N4, N3) and the second supply terminal 307. The second transistor N2 of the second function selection circuit 309b is coupled between the output 203b-3 of the first delay element 203b and the second supply terminal 307.

The transistors P1, N2 comprise a multiplexer input (or are connected to a multiplexer input) to receive a signal enable_p, of forcing the output 203b-3 of the first delay element 203b to logical zero (e.g. VSS). The transistors P2, N1 comprise a multiplexer input for receiving a signal enable_n to force the output 203b-3 of the first delay element 203b to logical one (e.g. VDD).

In the implementation shown in FIG. 3c the transistors P1-P4 are PMOS transistors and the transistors N1-N4 are NMOS transistors. A high level of the signals enable_p and enable_n forces the output 203b-3 of the first delay element 203b to zero. A low level of the signals enable_n and enable_p forces the output 203b-3 of the first delay element 203b to one. A low level of the signal enable_p and a high level of the signal enable_n activates the inverters 301, 303 and therefore the delay element 203b such that the output signal E at the output 203b-3 is based on the interpolation between the input signals C, B at the inputs 203b-1, 203b-2.

The function selection circuits 309a, 309b may be connected to a start edge multiplexer 311b of the first delay element 203b for inserting a start edge into the delay line 300.

From FIG. 3a it may be seen that a plurality of such start edge multiplexers can be provided. In the example shown in FIG. 3a for each first delay element 203a to 203c a start edge multiplexer 311a to 311c is provided and for each second delay element 205a to 205c a start edge multiplexer 313a to 313c is provided.

Furthermore, a start edge multiplexer 315 is provided for the first delay element 303 of the further differential delay stage 301 and another start edge multiplexer 317 is provided for the second delay element 305 of the further differential delay stage 301.

In further exemplary implementations of the delay line 200 it may be sufficient to implement one such start edge multiplexer (e.g. per chain of the differential delay line 300).

To summarize, the delay element 203b includes a start edge injection input (e.g. at which it receives the signals enable_p, enable_n) for forcing the output 203b-3 of the delay element 203b to a predetermined potential independent of the potential of the input signals of the delay element 203b.

Furthermore, (not shown in FIG. 3a) the differential delay line 300 can comprise a start edge injector configured to inject a start edge into the differential delay line 300. This start edge injector may be configured to vary the injection point at which the start edge is inserted into the differential delay line 300. As an example, such start edge injector may choose a pair of start edge multiplexers belonging to the same differential delay stage for inserting the start edge at this differential delay stage.

In the example of FIG. 3c the delay element 203b includes two inputs (also referred to as interpolation inputs). However, a delay element including additional inputs, i.e., more than two inputs, may also be used. In the example shown in FIG. 3c, the delay element 203b has the two inverters 301, 303 coupled between the two inputs 203b-1 and 203b-2 and the output 203b-3 of the delay element 203b. When a delay element having more than two inputs is used, such a delay element may comprise an (associated) inverter coupled between the respective input and the (common) output of the delay element. In other words, a delay element may comprise further inputs, wherein each of the further inputs is coupled to an output of the first delay element or the second delay element of a differential delay stage preceding the differential delay stage of the delay element. Such further input may be coupled to outputs of the delay elements in the same chain as the delay element or delay elements in the other chain as the delay element.

Hence, in further exemplary implementations of the delay line 200, a delay element (or each delay element) is configured to receive a plurality of input signals and to provide its output signal by performing interpolations based on the input signal received at its inputs.

Furthermore, the inputs 203b-1, 203b-2 are data inputs (and not supply inputs) and the output 203b-3 is a data output (and not a supply output).

FIG. 3b demonstrates using multipath interpolation for the differential delay line 300 in a differential manner to synchronize the independent running single-ended chains of the delay line 300 and for resolution enhancement over the conventional single-ended multipath ring oscillator.

Figure 3D:
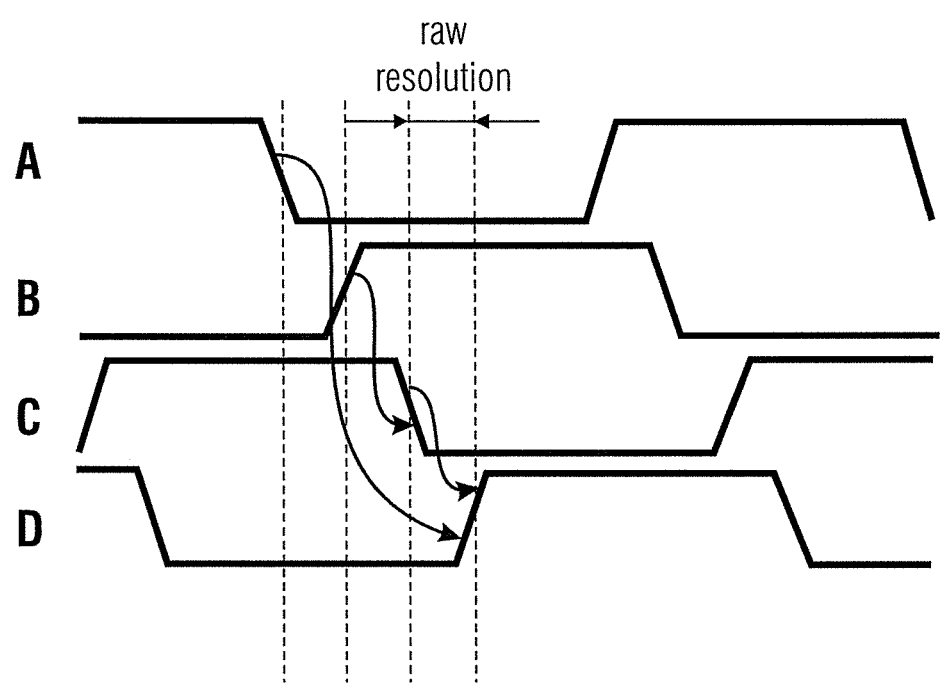
FIG. 3d shows a working principle of a single ended multipath ring oscillator.

A principle of such conventional single-ended multipath ring oscillator is shown in FIG. 3d. The falling edge of the output signal A and the falling edge of the output signal A are interpolated with a delay element to the rising edge D. The unit delay is the time between rising and falling edge (even delay) or falling and rising edge (odd delay). As shown in FIG. 3d, the raw resolution between falling edge A and rising edge B, falling edge C and rising edge D is much below the intrinsic resolution of the delay rising/falling edge in signal A. By comparing the FIGS. 3b and 3d it may clearly be seen that the delay between the falling edge of signal A and the rising edge of signal F is much smaller than the delay between the falling edge of signal A and the rising edge of signal D in FIG. 3d. Hence, by using an interpolation between the different chains of a differential delay line, the resolution of the differential delay line may be improved as the delays between an input signal and a resulting (interpolated) output signal may be designed much shorter.

Figure 4:
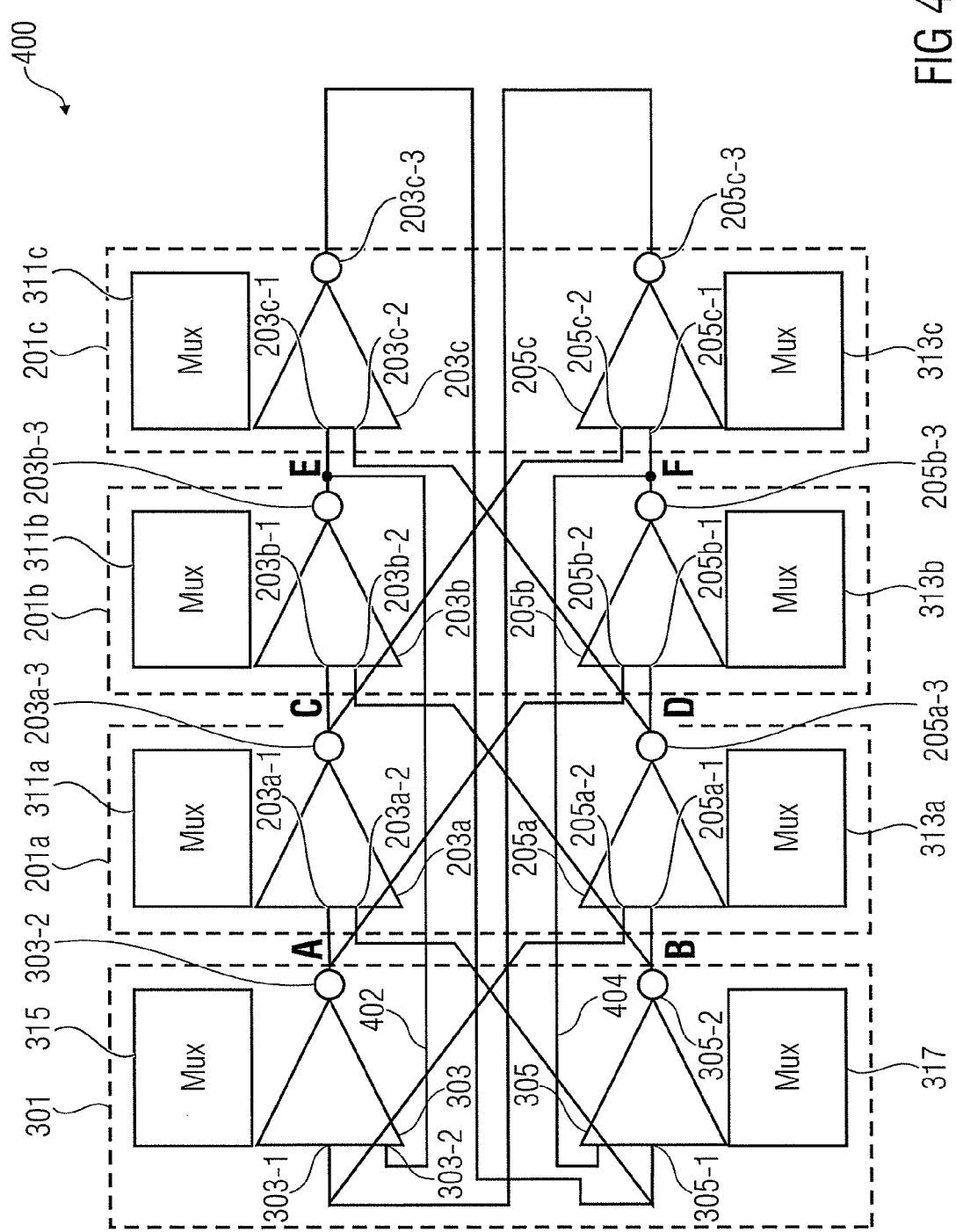
FIG. 4 shows an exemplary ring oscillator comprising an exemplary implementation of the differential delay line shown in FIG. 2.

FIG. 4 shows an exemplary ring oscillator 400. The ring oscillator 400 includes the delay line 300 of FIG. 3. Furthermore, the output 203c-3 of the (n+m)-th differential delay stage 201c is coupled to the input 305-1 of the second delay element 305 of the further differential delay stage 301 and the output 205c-3 of the second delay element of the (n+m)-th differential delay stage 201c is coupled to the input 303-1 of the first delay element 303 of the further differential delay stage 301.

For the general case of a plurality of differential delay stages, the output of the first delay element of the last differential delay stage is coupled to an input of the second delay element of the first differential delay stage of the ring oscillator 400 and the output of the second delay element of the last differential delay stage is coupled to an input of the first delay element of the first differential delay stage of the differential ring oscillator 400.

In other words, for two succeeding differential delay stages of the ring oscillator 400, the output of a first delay element of one of the differential delay stages is not connected to an input of the first delay element of the succeeding differential delay stage, but to an input of the second delay element of the succeeding differential delay stage. Furthermore, the output of the second delay element of the differential delay stage is coupled to an input of the first delay element of the succeeding differential delay stage and not to an input of the second delay element of the succeeding differential delay stage.

In other words, for a pair of directly succeeding differential delay stages the outputs and the inputs are cross-coupled to insure the functionality of the differential ring oscillator 400.

An interpolation between the last differential delay stage and the first differential delay stage is possible when connecting the signal at E back to a further input 303-2 of the first delay element in stage 315, and connecting the signal at F back to a further input 305-2 of the second delay element in stage 315 (see lines 402 and 404 in FIG. 4).

To summarize, the differential delay line 200 and its exemplary implementations are based on a cross-coupling of differential ring oscillators or delay lines. This combines a multipath interpolation for resolution enhancement and a positive and negative delay chain synchronization (between the two delay chains of the differential delay line 200 and its exemplary implementations).

The differential delay line 200 and its exemplary implementations may be used, for example in differential ring oscillators as shown in FIG. 4. Such differential ring oscillator 400 may be used, for example, in time-to-digital converters, such as they are used in mobile communication devices.

Figure 5:
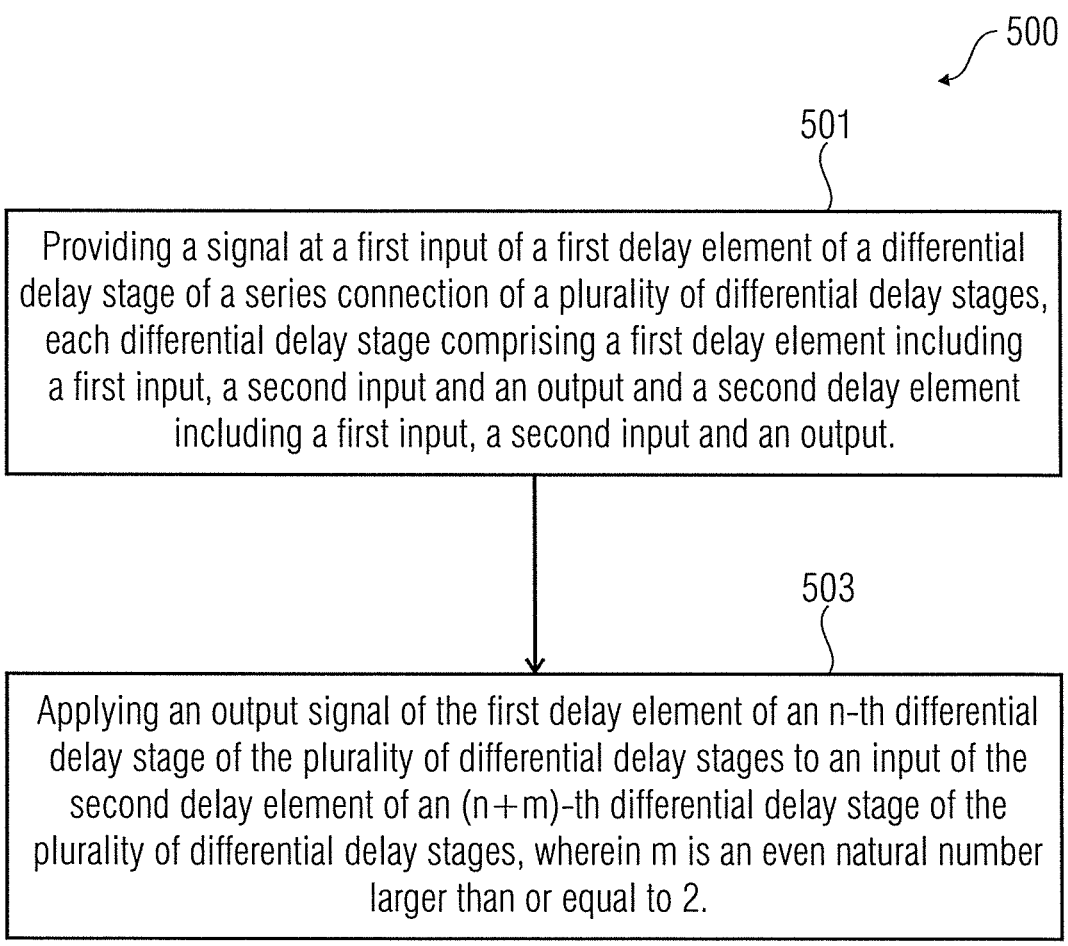
FIG. 5 shows a flow diagram of an exemplary method.

FIG. 5 shows a flow diagram of a method 500.

The method 500 includes a step 501 of providing a signal at a first input of a first delay element of a differential delay stage of a series connection of a plurality of differential delay stages. Each differential delay stage includes a first delay element having a first input, a second input and an output and a second delay element having a first input, a second input and an output.

The method 500 continues at step 503 by applying an output signal of the first delay element of an n-th differential delay stage of the plurality of differential delay stages to an input of the second delay element of an (n+m)-th differential delay stage of the plurality of differential delay stages, where m is an even natural number larger than or equal to 2.

In one example, the output signals are also applied to the first input of the first delay element of an (n+1)-th differential delay stage of the plurality of delay stages.

Furthermore, in another example, the input of the second delay element to which the output signal is provided is the second input of the second delay element of the (n+m)-th differential delay stage and an output signal provided at an output of the second delay element of an (n+m−1)-th differential delay stage of the plurality of delay stages is provided to the first input of the second delay element of the (n+m)-th differential delay stage.

The method 500 may be performed by an exemplary differential delay line ring or oscillator and their different/varied implementations.

Figure 6:
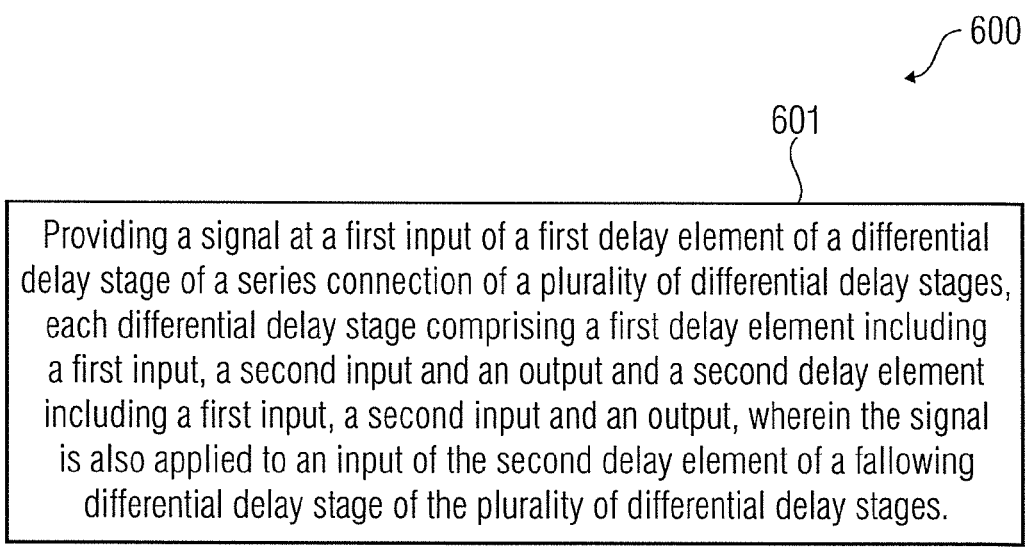
FIG. 6 shows a flow diagram of another exemplary method.

FIG. 6 shows a flow diagram of an exemplary method 600.

The method 600 includes a step 601 of providing a signal at the first input of a first delay element of a differential delay stage of a series connection of a plurality of differential delay stages. Each differential delay stage has a first delay element including a first input, a second input and an output and a second delay element including a first input, a second input and an output. The signal is also applied to an input of the second delay element of a following differential delay stage of the plurality of differential delay stages.

In one example, the input of the second delay element of the following differential delay stage to which the signal is applied is the second input of the second delay element of the following differential delay stage and an output signal provided at the output of the second delay element of the differential delay stage is applied to the first input of the second delay element of the following differential delay stage.

The method 600 may be performed by an exemplary differential delay line or ring oscillator and their exemplary implementations.

The methods 500, 600 may be supplemented by any of the features and functionalities described herein with respect to the apparatus, and may be implemented using the hardware components of the apparatus.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some examples, some one or more of the most important method steps may be executed by such an apparatus.

Depending on certain implementation requirements, examples may be implemented in hardware or in software. The implementation may be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some examples comprise a data carrier having electronically readable control signals, which are capable of cooperating with a programmable computer system, such that one of the methods described herein is performed.

Generally, examples may be implemented as a computer program product with a program code, the program code being operative for performing one of the methods when the computer program product runs on a computer. The program code may for example be stored on a machine readable carrier.

Other examples comprise the computer program for performing one of the methods described herein, stored on a machine readable carrier.

In other words, an implementation of the exemplary method is, therefore, a computer program having a program code for performing one of the methods described herein, when the computer program runs on a computer.

A further implementation of the exemplary method is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further implementation of the exemplary method is, therefore, a data stream or a sequence of signals representing the computer program for performing one of the methods described herein. The data stream or the sequence of signals may for example be configured to be transferred via a data communication connection, for example via the Internet.

A further example includes a processing means, for example a computer, or a programmable logic device, configured to or adapted to perform one of the methods described herein.

A further example includes a computer having installed thereon the computer program for performing one of the methods described herein.

A further example includes an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some examples, a programmable logic device (for example a field programmable gate array) may be used to perform some or all of the functionalities of the methods described herein. In some examples, a field programmable gate array may cooperate with a microprocessor in order to perform one of the methods described herein. Generally, the methods are performed by any hardware apparatus.

The above described examples are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the examples herein.

Although each claim only refers back to one single claim, the disclosure also covers any conceivable combination of claims.

What is claimed is:

1. A differential delay line comprising:
    a series connection of a plurality of differential delay stages, each differential delay stage comprising a first delay element including a first input, a second input and an output and a second delay element including a first input, a second input and an output; and
    wherein the output of the first delay element of an n-th differential delay stage of the plurality of differential delay stages is directly connected to an input of the second delay element of an (n+m)-th differential delay stage of the plurality of differential delay stages, wherein m is an even natural number larger than or equal to two.

2. The differential delay line according to claim 1, wherein the output of the first delay element of each differential delay stage is coupled to the first input of the first delay element of a succeeding differential delay stage; and
    wherein the output of the second delay element of each differential delay stage is coupled to the first input of the second delay element of the succeeding differential delay stage.

3. The differential delay line according to claim 1, wherein the input of the second delay element of the (n+m)-th differential delay stage to which the output of the first delay element of the n-th differential delay stage is coupled, is the second input of the second delay element of the (n+m)-th differential delay stage.

4. The differential delay line according to claim 1, wherein the output of the second delay element of the n-th differential delay stage is coupled to an input of the first delay element of the (n+m)-th differential delay stage.

5. The differential delay stage according to claim 1, wherein the second delay element of the (n+m)-th differential delay stage is configured to provide an output signal at its output based on an inverted version of a signal received at its first input and an inverted version of a signal received at its second input.

6. The differential delay line according to claim 1, wherein the second delay element of the (n+m)-th differential delay stage comprises further inputs, each of the further inputs being coupled to an output of a first delay element or a second delay element of a differential delay stage preceding the (n+m)-th differential delay stage.

7. The differential delay line according to claim 1, wherein the second delay element of the (n+m)-th differential delay stage comprises per input an inverter coupled between the respective input and the output of the second delay element of the (n+m)-th differential delay stage.

8. The differential delay line according to claim 1, wherein the inputs of each delay element are data inputs and the output of each delay element is a data output.

9. The differential delay line according to claim 1, wherein the second delay element of the (n+m)-th differential delay stage is configured to generate an output signal at its output by performing an interpolation based on signals received at its inputs.

10. The differential delay line according to claim 1, wherein the output of the first delay element of the n-th differential delay stage is directly connected to the input of the second delay element of the (n+m)-th differential delay stage.

11. The differential delay line according to claim 1, wherein the output of the first delay element of each differential delay stage is coupled to an input of the second delay element of a next differential delay stage.

12. The differential delay line according to claim 1, wherein at least a first delay element of a differential delay stage of the plurality of differential delay stages comprises a start edge injection input for forcing the output of the first delay element to a predetermined potential independent of potentials at the inputs of the first delay element.

13. The differential delay line according to claim 12, wherein furthermore a first delay element of a further differential delay stage of the plurality of differential delay stages comprises a start edge injection input for forcing the output of the first delay element of the further differential delay stage to the predetermined potential.

14. The differential delay line according to claim 1, further comprising:
    a start edge injector configured to inject a start edge into the differential delay line; and
    wherein the start edge injector is configured to vary an injection point at which the start edge is inserted into the differential delay line.

15. The differential delay line according to claim 1, wherein the first and second delay elements include at least one further input.

16. A differential ring oscillator comprising:
    a differential delay line comprising:
    a series connection of a plurality of differential delay stages, each differential delay stage comprising a first delay element including a first input, a second input and an output and a second delay element including a first input, a second input and an output;

wherein the output of the first delay element of an n-th differential delay stage of the plurality of differential delay stages is directly connected to an input of the second delay element of an (n+m)-th differential delay stage of the plurality of differential delay stages, wherein m is an even natural number larger than or equal to two.

17. The differential ring oscillator according to claim 16, wherein the output of the first delay element of a last differential delay stage of the differential delay line is coupled to an input of the second delay element of a first differential delay stage of the differential delay line; and wherein the output of the second delay element of the last differential delay stage is coupled to an input of the first delay element of the first differential delay stage of the differential delay line.

18. A differential delay line comprising:

a series connection of a plurality of differential delay stages, each differential delay stage comprising a first delay element including a first input, a second input and an output and a second delay element including a first input, a second input and an output;

wherein a signal at the first input of the first delay element of a differential delay stage of the plurality of differential delay stages is directly applied to an input of the second delay element of a following differential delay stage of the plurality of differential delay stages.

19. The differential delay line according to claim 18, wherein the differential delay stage is the n-th differential delay stage and the following differential delay stage is an (n+i)-th differential delay stage, wherein i is an odd number larger than or equal to 1.

20. The differential delay line according to claim 18, wherein the input of the second delay element of the following differential delay stage to which the signal is applied to, is the second input of the second delay element of the following differential delay stage; and wherein furthermore an output signal at an output of the second delay element of the differential delay stage is provided to the first input of the second delay element of the following differential delay stage.

21. The differential delay line according to claim 18, wherein a further signal at the first input of the second delay element of the differential delay stage is supplied to an input of the first delay element of the following differential delay stage.

22. The differential delay line according to claim 18, wherein the signal is provided from the first input of the first delay element of the differential delay stage to the input of the second delay element of the following differential delay stage without any further delay element in between.

23. A mobile communication device comprising:

an antenna port;

an RF-frontend;

a digital baseband processor; and a differential delay line comprising:

a series connection of a plurality of differential delay stages, each differential delay stage comprising a first delay element including a first input, a second input and an output and a second delay element including a first input, a second input and an output; and wherein the output of the first delay element of an n-th differential delay stage of the plurality of differential delay stages is directly connected to an input of the second delay element of an (n+m)-th differential delay stage of the plurality of differential delay stages, wherein m is an even natural number larger than or equal to two;

wherein the differential delay line is comprised in the RF-frontend or in the digital baseband processor; and wherein the RF-frontend is coupled to the antenna port and the digital baseband processor.

24. The mobile communication device according to claim 23, wherein the differential delay line is comprised in a time-to-digital converter of the RF-frontend or the digital baseband processor.

25. A mobile communication device comprising:

an antenna port;

an RF-frontend;

a digital baseband processor; and a differential delay line comprising:

a series connection of a plurality of differential delay stages, each differential delay stage comprising a first delay element including a first input, a second input and an output and a second delay element including a first input, a second input and an output;

wherein a signal at the first input of the first delay element of a differential delay stage of the plurality of differential delay stages is directly applied to an input of the second delay element of a following differential delay stage of the plurality of differential delay stages;

wherein the differential delay line is comprised in the RF-frontend or in the digital baseband processor; and wherein the RF-frontend is coupled to the antenna port and the digital baseband processor.

26. The mobile communication device according to claim 25, wherein the differential delay line is comprised in a time-to-digital converter of the RF-frontend or the digital baseband processor.

27. A method comprising:

providing a signal at a first input of a first delay element of a differential delay stage of a series connection of a plurality of differential delay stages, each differential delay stage comprising a first delay element including a first input, a second input and an output and a second delay element including a first input, a second input and an output; and directly applying an output signal of the first delay element of an n-th differential delay stage of the plurality of differential delay stages to an input of the second delay element of an (n+m)-th differential delay stage of the plurality of differential delay stages, wherein m is an even natural number larger than or equal to 2.

28. The method according to claim 27, wherein the output signal is also applied to the first input of the first delay element of an (n+1)-th differential delay stage of the plurality of differential delay stages.

29. The method according to claim 27, wherein the input of the second delay element to which the signal is provided is the second input of the second delay element of the (n+m)-th differential delay stage; and wherein an output signal provided at an output of the second delay element of an (n+m−1)-th differential delay stage of the plurality of differential delay stages is provided to the first input of the second delay element of the (n+m)-th differential delay stage.

30. A method comprising:

providing a signal at a first input of a first delay element of a differential delay stage of a series connection of a plurality of differential delay stages, each differential delay stage comprising a first delay element including a first input, a second input and an output and a second delay element including a first input, a second input and an output; and wherein the signal is directly applied to an input of the second delay element of a following differential delay stage of the plurality of differential delay stages.

31. The method according to claim 30, wherein the input of the second delay element of the following differential delay stage to which the signal is applied is the second input of the second delay element of the following differential delay stage; and wherein an output signal provided at the output of the second delay element of the differential delay stage is applied to the first input of the second delay element of the following differential delay stage.

32. A differential delay line comprising:

a series connection of a plurality of differential delay stages, each differential delay stage comprising a first delay element including a first input, a second input and an output and a second delay element including a first input, a second input and an output;

wherein the output of the first delay element of each differential delay stage is coupled to the second input of the second delay element of the next-but-one differential delay stage and the output of the second delay element of each differential delay stage is coupled to the second input of the first delay element of the next-but-one differential delay stage;

wherein the output of the first delay element of each differential delay stage is further coupled to the first input of the first delay element of the next differential delay stage and the output of the second delay element of each differential delay stage is further coupled to the first input of the second delay element of the next differential delay stage; and wherein each delay element comprises a first inverter coupled between the first input and the output of the delay element and a second inverter coupled between the second input and the output of the delay element.

* * * * *